United States Patent [19]

Welzhofer

[11] 4,329,728

[45] May 11, 1982

[54] TRANSISTOR PUSH-PULL OUTPUT STAGE

[75] Inventor: Klaus Welzhofer, Graefelfing, Fed. Rep. of Germany

[73] Assignee: Siemens Aktiengesellschaft, Berlin & Munich, Fed. Rep. of Germany

[21] Appl. No.: 204,549

[22] Filed: Nov. 6, 1980

[30] Foreign Application Priority Data

Dec. 21, 1979 [DE] Fed. Rep. of Germany ....... 2951928

[51] Int. Cl.$^3$ .............................................. H02H 3/20
[52] U.S. Cl. ................................ 361/91; 330/207 P; 330/298; 361/101
[58] Field of Search ......................... 361/91, 100, 101; 330/298, 207 P, 262

[56] References Cited

U.S. PATENT DOCUMENTS

| | | | |
|---|---|---|---|
| 3,967,207 | 6/1976 | Wheatley, Jr. | 330/207 P X |
| 3,968,382 | 7/1976 | Tsurushima | 361/91 X |
| 4,216,437 | 8/1980 | Sakaida | 330/298 |
| 4,227,227 | 10/1980 | Yamaguchi | 330/298 X |

OTHER PUBLICATIONS

IBM Technical Disclosure Bulletin, vol. 14, No. 3, Aug. 1971 "Power Amplifier with output Stage Protect Circuit," Lamoreaux.

Primary Examiner—Reinhard J. Eisenzopf
Attorney, Agent, or Firm—Hill, Van Santen, Steadman, Chiara & Simpson

[57] ABSTRACT

A transistor push-pull output stage, particularly for pulse shapers having inverse feedback from the output to the input, as well as a high-resistance input and a low-resistance output is disclosed. In testing components of data technology, short circuits in the component should not lead to the destruction of the output stage of the testing apparatus. To this end, the invention provides that a field effect transistor is employed in each push-pull stage as the input transistor, the field effect transistor respectively driving the parallel connection of a plurality of output transistors by way of an emitter follower stage. The bases of the output transistors are driven by way of a constant current source which is switched off given overvoltage of the output. The transistors and the push-pull stages are complementary to one another. In addition, a structure is provided for the power supply which is driven as a function of the voltage shift and of the pulse basic voltage of the signal. The transistor push-pull output stage is particularly suited as the output stage for a pulse shaper in an automatic testing unit for data processing devices.

6 Claims, 2 Drawing Figures

TRANSISTOR PUSH-PULL OUTPUT STAGE

BACKGROUND OF THE INVENTION

1. Field of the Invention

The present invention relates to a transistor push-pull output stage, particularly for pulse shapers having inverse feedback from the output to the input, as well as a high-resistance input and a low-resistance output.

2. Description of the Prior Art

In known output stages for pulse shapers, a low-resistance short circuit to an external power supply voltage often leads to destruction of the output stage, causing partially wearisome and cost-intensive use of maintenance personnel.

SUMMARY OF THE INVENTION

The object of the present invention, therefore, is to provide a short circuit proof output stage for four-quadrant operation. In order to achieve the foregoing object, the transistor push-pull output stage is designed in such a manner that a field effect transistor is employed in each push-pull stage as the input transistor, the field effect transistor respectively driving the parallel connection of a plurality of output transistors by way of an emitter-follower stage in such a manner that the bases of the output transistors are driven with a constant current source which is switched off given an overvoltage at the output; that the transistors in the two push-pull stages are complementary to one another; and that means for power supply are provided which are driven as a function of the voltage shift and of the pulse basic voltage of the signal.

By the above measures, one obtains an output stage which is suitable, particularly, for use given pulse shapers that are employed in testing systems, since this output stage is adapted to the malfunction possibilities of the test specimens, i.e. short circuits or, respectively, negative feed to or from the supply voltages occurring in the testing system cannot destroy the output stage. It can both absorb power as well as emit power, whereby the outputs can be switched off given an overvoltage.

Thereby, the overvoltage structure can be advantageously designed in such a manner that a controlled switch, preferably a transistor, is connected in series with the constant current source of each push-pull stage, the switch being actuated by an overvoltage circuit such as, for example, a bistable flip-flop given inadmissible overvoltages at the output.

The floating power supply can be designed in a suitable manner such that, per push-pull stage, it comprises an operational amplifier having power transistors connected to the output of the operational amplifier, the power transistors having emitter circuit resistors through which the output turn of the respective push-pull stage flows at the same time; and that the collector segment of a further transistor respectively lies in the base-emitter circuit of the power transistors, the base of the further transistor connected at the junction point of the emitter of the power transistors and the precision resistors.

Thereby, a particularly favorable embodiment for the floating power supply resides in the fact that the control inputs of the operational amplifiers lie in a bridge diagonal of a Wheatstone bridge to which the shift voltage and the pulse basic voltage of the signal are also supplied as control magnitudes.

It is advantageous for increasing the short circuit resistance that diodes are connected between the operational amplifiers and the power transistors.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
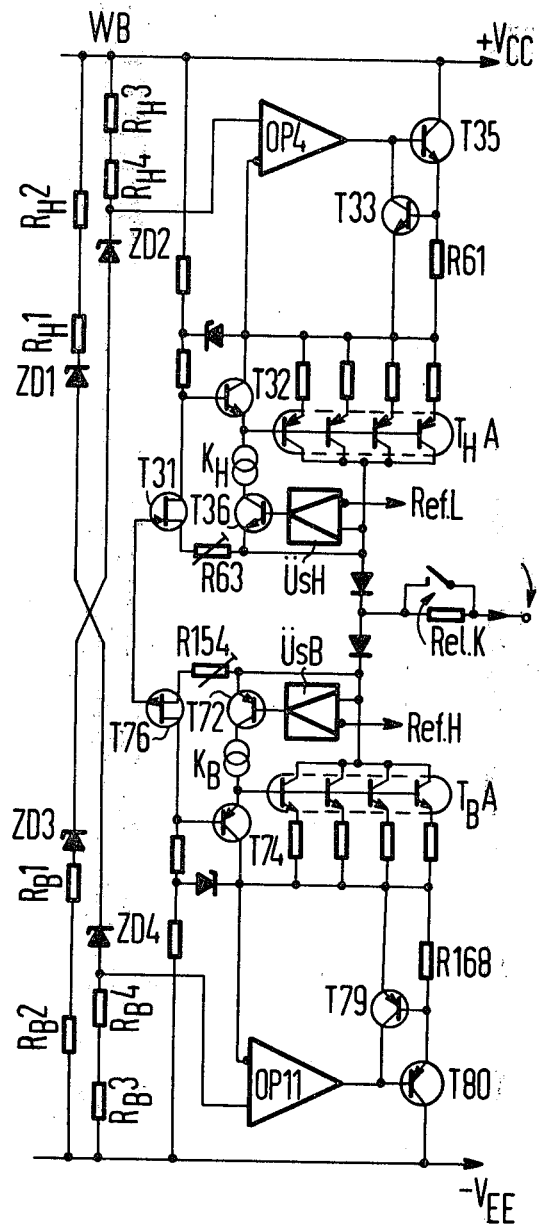
FIG. 1 is a simplified schematic circuit diagram of a push-pull output stage constructed in accordance with the present invention.
Figure 2:
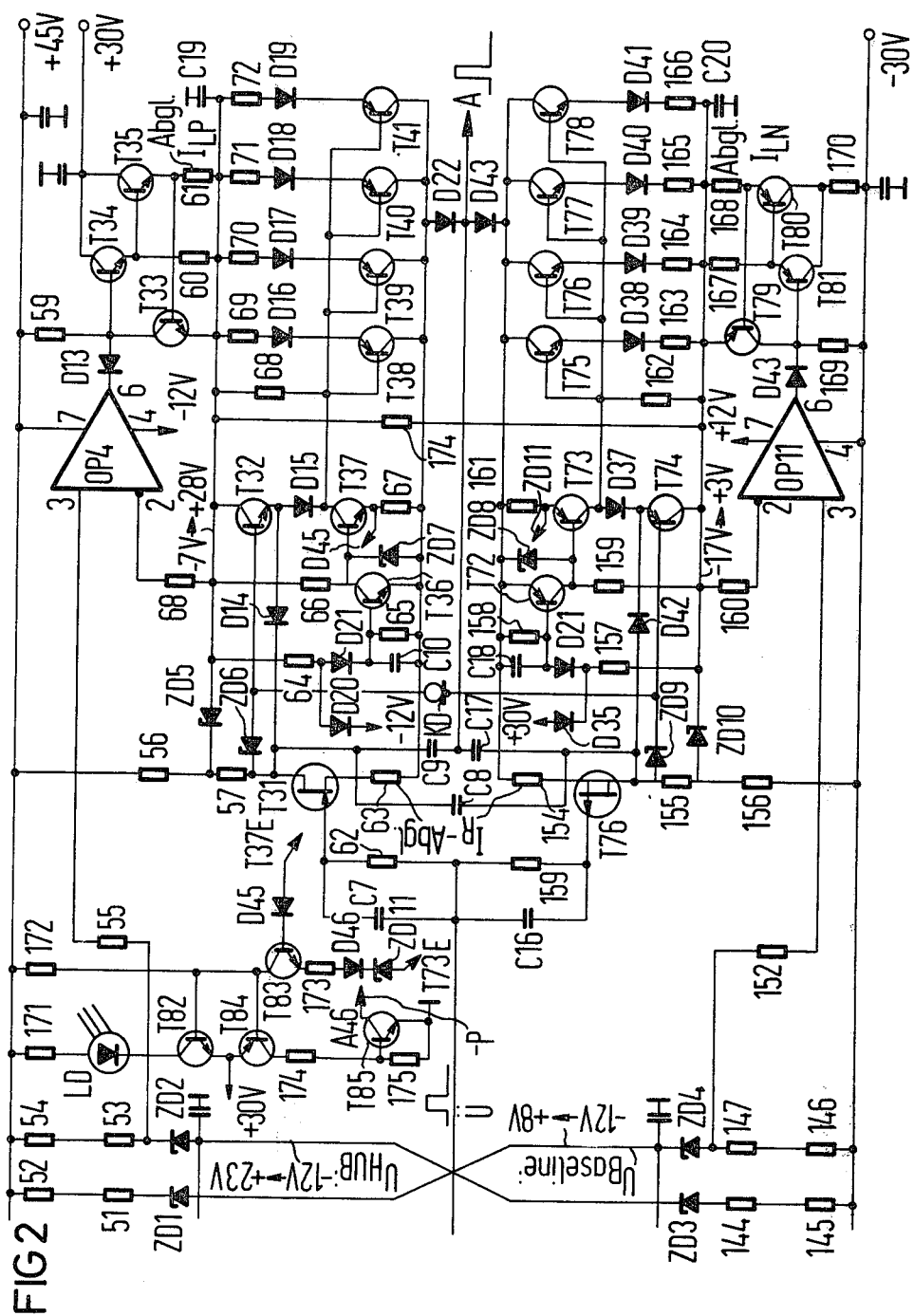
FIG. 2 is a more detailed schematic circuit diagram of the push-pull output stage of FIG. 1.

The output stage constructed in accordance with the present invention is constructed of two halves which are mirror symmetrical, whereby each half is supplied with current from its own power constant voltage source (OP11/T80 and OP4/T35). The voltages for the respective voltage sources are obtained by way of the Zener diodes ZD2 and ZD4 set up to a programmable voltage $U_{HUB}$ or, respectively $U_{Baseline}$. With this construction, which is a Wheatstone bridge having a diagonal connected to the control inputs of the operational amplifiers OP4 and OP11, a floating power supply is derived for the output stage semiconductors $T_HA$ or, respectively, $T_BA$, which has the advantage that the output stage transistors work with a constant and low power loss in normal operation, in contrast whereto the greater power loss occurs in the power supply transistors T80 and T35.

The power semiconductors T80 and T35 are protected against overload up to the response of the overvoltage protection (UsB or, respectively, UsH) by the transistors T33 and T79. Thereby, the transistors T33 or T79 measure the output current-dependent voltage drop at the resistors R61 or, respectively, R168 and thereby limit the output current to the admissible value. In this case, the output operates as a constant current source. If, in the case of a short circuit, a voltage which is more negative than the internal reference voltage Ref L or a short circuit voltage which is more positive than the reference voltage Ref. H is applied in a low-resistance manner to the output, than the overvoltage protection circuits UsB or, respectively, UsH respond which then respectively block the transistors T72 or, respectively, T36, whereby the output stage transistors $T_BA$ or $T_HA$ no longer receive any base current from the constant current sources $K_B$ or $K_H$, which leads to their shut down. In this case, the overvoltage short circuit at the output must be eliminated, since the output stage will otherwise not automatically return into active operation. The quiescent forward current of the output stage is set with the resistors R63 and R154. A relay contact Rel. K reverses the output resistance.

The operating voltage for the power supply of the output stage are tapped by way of the resistors 55 and 152 connected to the Zener diodes ZD2 and ZD4.

The power supply for the respective half of the output stage is constructed of the components OP4/D13/T33/T35 and is regulated by the shift voltage.

The power supply for the negative half of the output stage is constructed of the components OP11/D43/T79/T80/T81 and is regulated by the pulse basic voltage. Each of the two power supplies fundamentally represents a voltage follower whose output voltage follows the guidance voltage due to the inverse feedback via the resistors R68 or, respectively, R160:

$$U_{OP46} = U_{OP43} + J_{10} \cdot R_{61} + U_{BE}T_{35} + U_{BE}T_{24} - U_D13$$

$$U_{OP116} = U_{OP113} + J_{LS} \cdot R_{168} - U_{BE}T_{80} - U_{BE}T_{80} - U_{BE}T_{81} + U_D43$$

$J_{LQ}$ = Source current of the output A
$J_{LS}$ = sink current of the output A The guidance or operating voltages are laid out by the Zener diodes ZD2 or, respectively, ZD4 in such a manner that the power supply for each half of the output stage is set, for example, to 5 volts overvoltage with respect to the programmed basic voltage or, respectively, shift voltage.

The transistors T33 and T79 respectively measure the load-dependent voltage drop at the resistors R61 and R168. When this voltage drop reaches a value at which a base current begins to flow at the transistors T33 and T79, these transistors become conductive and thereby assume the base currents of the transistors T34 and T81. These semiconductors are therefore blocked. When the transistors T35 or T80 are blocked, then the current through the resistor R61 or the resistor R161 is also turned off, i.e. the excess current case is again neutralized, which leads to a renewed switching-on of the transistor T35 or, respectively, the transistor T80; therefore, there arises a load-dependent sawtooth wave whose amplitude is smoothed by the capacitors C19 and C20. When the excess current transistors T33 and T79 are switched on, the diodes D13 and D43 disconnect the outputs of the operational amplifiers OP4 and OP11 from the load and thereby prevent destruction thereof in case of a short circuit.

The output stage is complementally constructed, whereby each half fundamentally represents a voltage follower/impedance converter stage counter-coupled via the resistors R63 and R154. The input pulse arrives at the "gates" of the field effect transistors T31 and T76 by way of the components C7/62 and C16/159. The transistors T31 and T76 are self-conductive depletion layer FET's which are operated in source circuit with the voltage gain:

$$V_T31 \approx S \cdot R_{57}$$

$$V_T76 \approx S \cdot R_{155}$$

$$S = \frac{2J_{DS}}{U_p^2}(U_{GS} - U_p)$$

S = Steepness of the FET mA/V
$J_{DS}$ = Drain current given $U_{GS}=0$
$U_p$ = Pinch-off voltage for $J_D=0$
$U_{GS}$ = Gate source voltage The phase-rotated pulse now respectively pending at the "drains" of the field effect transistors T31 and T76 is now applied d.c. voltage-shifted by way of the Zener diodes ZD6 or, respectively, ZD9 to the bases of the transistors T32 or, respectively, T74. The constant current generator KD sees to it that the Zener diodes ZD6 and ZD9 are constantly conductive. These measures cause the two field effect transistors to operate with a greater voltage $U_{DS}$, whereby a linear gain is achieved over the entire drive range. For this purpose, the two Zener diodes ZD5 and ZD10 increase the supply voltages at the drain resistors 57 and 155; these voltages likewise float d.c. shifted relative to the programming-dependent output stage supply voltages.

The transistors T32 and T74 operate in collector circuit (emitter follower) fashion, whereby their base-emitter path is protected against a disruptive breakdown by the diodes D14 or, respectively, D42, in the case of overvoltage short circuit situations.

By way of the diodes D15 and D37, the components T37/ZD7/67 and T73/ZD8/161 form a constant current load for the emitter followers T32 and T74 with:

$$J_CT_{37} = \frac{/U_{ZD7}/ - /U_{BE}T_{37}/}{R_{67}} \cdot \left(1 - \frac{1}{B_{T37}}\right)$$

$B_{T37}$ = current gain of $T_{37}$ $$J_CT_{73} = \frac{/U_{ZD9}/ - /U_{BE}T_{73}/}{R_{161}} \cdot \left(1 - \frac{1}{B_{T37}}\right)$$

$B_{T73}$ = current gain of $T_{73}$

In case of overvoltage short circuit conditions, the transistors T36 and T72 switch off the above current sources, whereby the output stage transistors T38, T39, T40, T41 or, respectively, T75, T76, T77, T78 likewise no longer receive base current and are blocked by way of the resistors 68 and 162.

If, for example, the short circuit overvoltage at the output becomes $$-12 V - /U_{BE}T_{36}/$$

or $$+30 V + /U_{BE}T_{72}/$$

then the transistor T36 or the transistor 72 becomes conductive and, therefore, the shutdown routine is activated.

The components C10/64 or, respectively, C18/157 respectively form an integrating element, whereby the above shutdown routine responds somewhat delayed according to the expression $$U_BT_{37} = \frac{1}{R_{64} \cdot C_{10}} \int U_{Usp} \cdot dt$$

$U_BT_{37}$ = voltage at the base of $T_{37}$
$U_{Usp}$ = Differential voltage $-12$ V to the feeding overvoltage $$U_BT_{72} = \frac{1}{R_{157} \cdot C_{18}} \int U_{Usp} \cdot dt$$

$U_{BT}$ = Voltage at the base of $T_{72}$
$U_{Usp}$ = Differential voltage $+30$ V to the feeding overvoltage By so doing, it is achieved that short overvoltage needle pulses (for example, reflections at misterminated output lines, etc) do not yet switch off the output stage.

The output stage itself is formed of four respective transistors T38–T41 and T75–T78 connected in parallel, whereby the diodes D16–D19 and D38–D41 respectively operate in a temperature-compensating manner with respect to the diode 15 or, respectively the diode D37, and the resistors 69–72 or, respectively 163–166, in contrast thereto, compensate the unit-dependent parameter scatterings of the output stage transistors by means of current feedback. For the approximate voltage gain of each output stage half, the following expression applies:

$$V = \frac{\Delta U_A}{\Delta U_E} = \frac{R_C}{R_{69}//R_{70}//R_{71}//R_{72}}$$

$$V = \frac{\Delta U_A}{\Delta U_E} = \frac{R_C}{R_{163}//R_{164}//R_{165}//R_{166}}$$

For the overall voltage gain of each output stage half, therefore, the voltage gain of the respective FET input stage is multiplied with the voltage gain of the output stage. Due to the inverse feedback by way of the resistors 63 or, respectively 154, however, there occurs an overall voltage gain of 1; however, the output resistance is reduced by the factor of the overall voltage gain.

The power diodes D22 and D43 likewise serve as an overvoltage protection in that they prevent a destructive pole reversal of the base-collector or, respectively, collector-emitter path of the output stage transistors. This would occur, for example, when:

$$U_{sp}A = U_B T_{75}/T_{76}/T_{77}/)78$$

or $$U_{sp}A = U_B T_{38}/T_{39}/T_{40}T_{41}$$

$U_B$ = Base voltage at T.

The transistors T82, T83, T84, T85 form the overvoltage short circuit indicator. In normal operation, the transistor T83 is maintained conductive by way of the elements D45, 173, D46 and ZD11:

$$J_C T_{83} = \frac{U_E T_{37} + U_E T_{73} - (U_D 45 + U_{BE} T_{83} + U_D 46 + U_{ZD} 11)}{R_{173}} \left(1 - \frac{1}{B_T 83}\right)$$

This collector current flows through the base of the transistor T84 which is thereby driven conductive into the saturated state. The transistor T82, on the other hand, is blocked, so that the luminescent diode LD does not respond. Because of the conductive transistor T84, the transistor T84 is also conductive (via the resistor 174), so that the output pin A46 carries a logical "0", i.e. no overvoltage short circuit is indicated. If, on the other hand, one of the two transistors T37 or T73 becomes blocked due to an overvoltage short circuit at the output side, then the voltage between the emitters of the above transistors is also reduced, whereby the transistor T83 becomes blocked. By way of the resistor 172, this action causes a base current for the transistor T82 and the luminescent diode is turned on. The transistor T84 and T85 are now blocked, so that the output pin 846 carries a logic "1" given connection of an external collector resistance.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A transistor output circuit including a plurality of push-pull output stages, particularly for pulse shapers having inverse feedback from the output to the input and a high-resistance input and a low-resistance output, comprising:
    an input transistor in each push-pull stage comprising a field effect transistor;
    a plurality of output transistors and an emitter-follower in each of said stages;
    constant current sources driving respective ones of said output transistors via said emitter followers, said constant current sources cut off in response to an overvoltage above a predetermined level at said output transistors;
    sensing means connected to said output transistors and to said current sources and operable to cut off said current sources in response to an overvoltage;
    said transistors of said stages being complementary to each other; and
    power supply means connected to said stages operable as a function of a voltage shift and a pulse base line voltage of an input signal.

2. The transistor output circuit of claim 1, and further comprising:
    a controlled switch in each of said stages connected in the respective stage in series with the respective constant current source; and
    an overvoltage circuit in the output of each stage connected to actuate the respective controlled switch in response to an overvoltage.

3. The transistor output circuit of claim 2, wherein said overvoltage circuit comprises a bistable flip-flop.

4. The transistor output circuit of claim 3, wherein said power supply means comprises:
    an operational amplifier in each of said stages;
    a power first transistor connected in each of said stages to the respective operational amplifier and comprising an emitter circuit including a resistor for carrying the output current;
    precision resistors; and
    a second transistor connected to the base-emitter circuit of said first transistor, said second transistor including a base connected between the junction of said emitter of said first transistor and said precision resistors.

5. The transistor output circuit of claim 4, and further comprising:
    a Wheatstone bridge for receiving an input signal including a diagonal;
    said operational amplifier including control inputs connected to said diagonal.

6. The transistor output circuit of claim 5, and further comprising:
    diodes connected between said operational amplifiers and said first transistors.

* * * * *